United States Patent
Rhodes

(10) Patent No.: US 6,812,539 B1
(45) Date of Patent: Nov. 2, 2004

(54) IMAGER LIGHT SHIELD

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/410,191

(22) Filed: Apr. 10, 2003

(51) Int. Cl.[7] ............................................. H01L 29/72
(52) U.S. Cl. ................... 257/435; 257/436; 257/438; 257/440
(58) Field of Search ............................ 257/436, 435, 257/438, 440

(56) References Cited

U.S. PATENT DOCUMENTS

| 6,198,087 B1 | 3/2001 | Boon |
| 6,235,549 B1 | 5/2001 | Bawolek et al. |
| 6,278,169 B1 | 8/2001 | Sayuk et al. |
| 6,316,814 B1 | 11/2001 | Nagata et al. |
| 6,335,540 B1 | 1/2002 | Zhang |
| 2004/0012029 A1 * | 1/2004 | Bawolek et al. ............ 257/98 |

OTHER PUBLICATIONS

S.S. Akbay, et al. "A CMOS Visible Image Sensor Array Using Current Mirroring Integration Readout Circuitry" Eurosensors XIV Aug. 27, 2000.

Nathan Cheung, U.C. Berkeley, "Basic Structure of CMOS Inverter" EE143 Lecture #20, printed from worldwide web 2002.

Orly Yadid-Pecht, et al. "CMOS Active Pixel Sensor Star Tracker with Regional Electronic Shutter" IEEE Journal of Solid-State Circuits, vol. 32, No. 2, Feb. 1997.

K. M. Findlater, et al. "A CMOS Image Sensor Employing a Double Junction Photodiode" Dept. of Electronics and Electrical Engineering, the University of Edinburgh, printed from worldwide web 2002.

T. Satoh, et al. "Optical Limitations to Cell Size Reduction in IT-CCD Image Sensors" NEC Corporation 1995 IEEE.

* cited by examiner

Primary Examiner—Edward Wojciechowicz
(74) Attorney, Agent, or Firm—Dickstein Shapiro Morin & Oshinsky LLP

(57) ABSTRACT

An improved imager pixel arrangement having a light shield over the pixel circuitry, but below the conductive interconnect layers of the pixel. The light shield can be a thin film of opaque (or nearly-opaque) material with openings for contacts to the underlying circuitry. An aperture in the light shield exposes the active region of the pixel's photoconversion device.

34 Claims, 15 Drawing Sheets

IMAGER LIGHT SHIELD

FILED OF THE INVENTION

The invention relates to light shields for photoimagers and to methods of forming and using them.

BACKGROUND

A CMOS imager circuit includes a focal plane array of pixel cells, each one of the cells including a photoconversion device, for example, a photogate, a photoconductor, or a photodiode, for generating and accumulating photo-generated charge in a portion of the substrate. A readout circuit is connected to each pixel cell and includes at least an output transistor, which receives photogenerated charges from a doped diffusion region and produces an output signal which is periodically read-out through a pixel access transistor. The imager may optionally include a transistor for transferring charge from the photoconversion device to the diffusion region or the diffusion region may be directly connected to or part of the photoconversion device. A transistor is also typically provided for resetting the diffusion region to a predetermined charge level before it receives the photo-converted charges. A CMOS imager circuit is often associated with a color filter, such as a Bayer filter for discerning varying wavelengths of light.

One typical CMOS imager pixel circuit, the three-transistor (3T) pixel, contains a photodiode for supplying photo-generated charge to a diffusion region; a reset transistor for resetting the diffusion region; a source follower transistor having a gate connected to the diffusion region, for producing an output signal; and a row select transistor for selectively connecting the source follower transistor to a column line of a pixel array. Another typical CMOS imager pixel employs a four-transistor (4T) configuration, which is similar to the 3T configuration, but utilizes a transfer transistor to gate charges from the photodiode to the diffusion region and the source follower transistor for output.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing are hereby incorporated by reference herein in their entirety.

Typical imager devices have a light shield providing apertures exposing at least a portion of the photoconversion devices to incoming light while shielding the remainder of the pixel circuit from the light. Light shields serve to better separate received light signals of adjacent pixels and prevent photocurrent from being generated in undesirable locations in the pixel so that the imager device can achieve higher resolution images with less blooming, blurring, and other detrimental effects. Light shields can also serve to protect the circuitry associated with the pixels.

In the prior art, light shields have typically been formed in the metal interconnect layering (e.g., Metal 1, Metal 2, or, if utilized, Metal 3 layers) of the integrated circuit. A metallization layer light shield structure has some drawbacks, such as limiting use of the metal layer to the light shield rather than for its normal conductive interconnect purpose. Additionally, having the light shield in upper metallization (conductive interconnect) layers spaced from the photo-sensitive area can increase light piping and light shadowing in the pixels, which can cause errors in device functioning.

SUMMARY

The present invention mitigates these drawbacks by providing an improved imager pixel arrangement having a light shield over the pixel circuitry, but below the metal interconnect layering. The light shield can be a thin film, which may be conformal or planar, of opaque (or nearly-opaque) material with openings for conductors to pass through from the conductive interconnect layers to the underlying circuitry. An aperture in the light shield exposes the active region of the pixel's photoconversion device. The invention also relates to methods for forming the light shield and an imager device incorporating the shield. The light shield and method of forming of the invention are particularly well suited for CMOS imager devices.

The light shield arrangement protects the underlying circuitry while saving the metallization (conductive interconnect) layers for normal signal routing purposes. Pixel light separation is achieved while mitigating undesired effects, e.g., blooming, blurring, light piping, and shadowing.

These and other advantages and features of the present invention will be more apparent from the following detailed description and drawings which illustrate various embodiments of the invention.

DETAILED DESCRIPTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

The terms "wafer" and "substrate" are to be understood as interchangeable and as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

The term "pixel" refers to a photo-element unit cell containing a photoconversion device and transistors for converting electromagnetic radiation to an electrical signal. The pixels discussed herein are illustrated and described as 4T pixel circuits for the sake of example only. It should be understood that the invention is not limited to a four transistor (4T) pixel, but may be used with other pixel arrangements having fewer (e.g., 3T) or more (e.g., 5T) than four transistors. Although the invention is described herein with reference to the architecture and fabrication of one pixel, it should be understood that this is representative of a plurality of pixels in an array of an imager device. In addition, although the invention is described below with reference to a CMOS imager, the invention has applicability to any solid state imaging device having pixels. The following detailed description is, therefore, not to be taken in a limiting sense, and the scope of the present invention is defined only by the appended claims.

Figure 1:
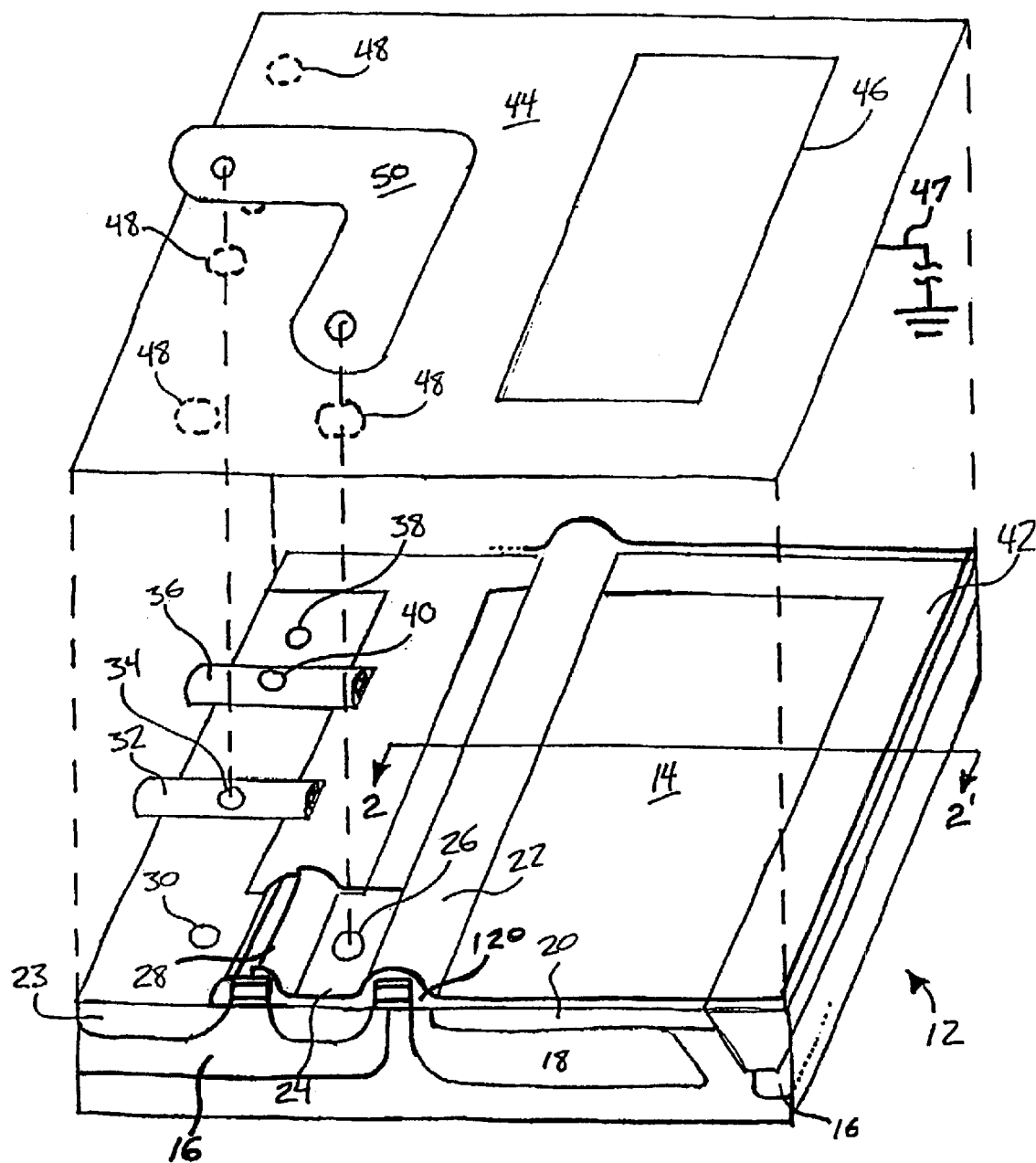
FIG. 1 is an exploded perspective view of a pixel in accordance with the invention.
Figure 2:
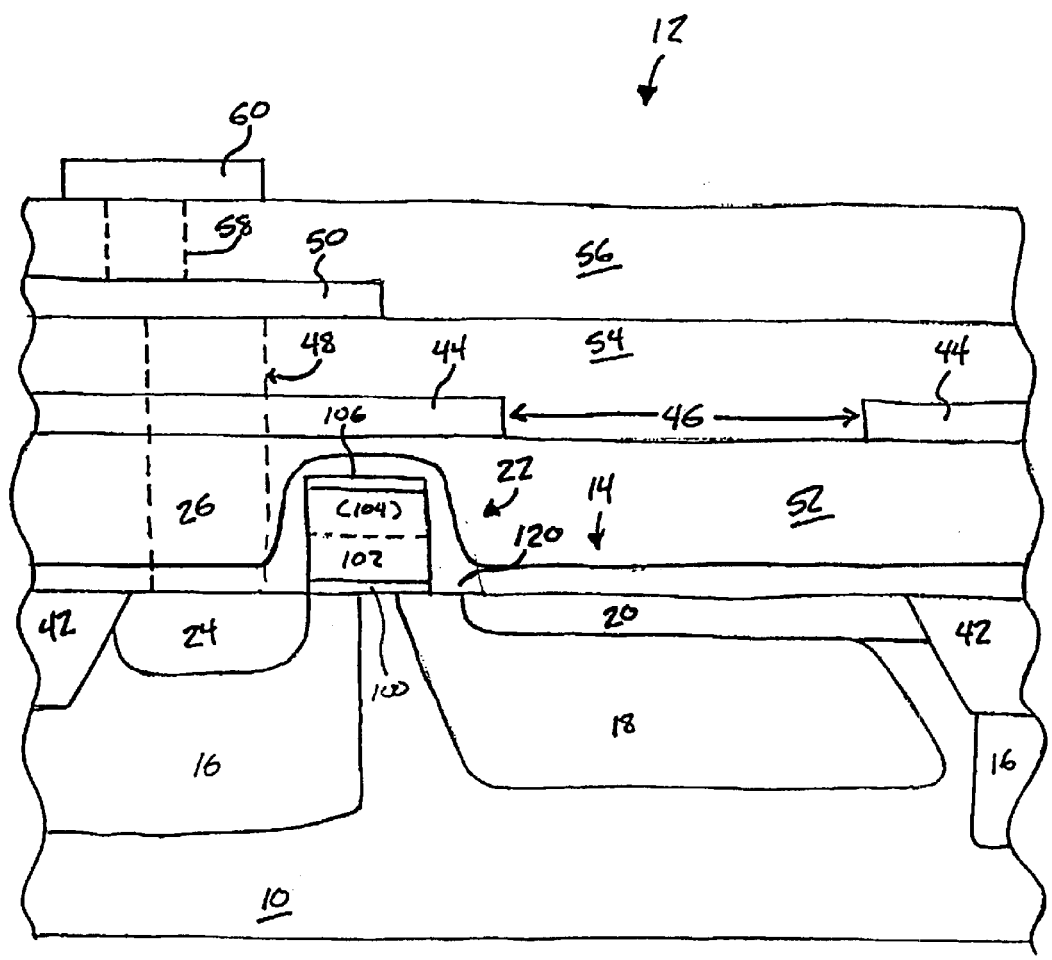
FIGS. 2 and 2a are partial cross-sectional views of the pixel of FIG. 1 through line 2–2', also showing additional conductive interconnect layers.

Now referring to the figures, where like reference numbers designate like elements, FIGS. 1 and 2 show an exemplary embodiment of the invention, exemplified in a four transistor (4T) CMOS pixel 12 using a photodiode 14 as a photoconversion device. The photodiode 14 is formed in a typically p-type substrate 10, and includes an n-type conductivity region 18 and an uppermost thin p-type conductivity layer 20 over the n-type region 18. It should be understood that while FIG. 1 shows the circuitry for a single pixel 12, in practical use there will be an M×N array of pixels 12 arranged in rows and columns with the pixels 12 of the array accessed using row and column select circuitry, as is known in the art. The pixel 12 shown can be laterally isolated from other pixels of the array by shallow trench isolation regions 42. Although the isolation region 42 is shown only along one side of the pixel 12 for simplicity sake, in practice it may extend around the entire perimeter of the pixel 12.

The 4T CMOS pixel 12 shown in FIG. 1 (and FIG. 2) is formed partially in and over a doped p-type region 16 in a substrate 10, and includes a photodiode 14, a transfer gate 22, a reset gate 28, a source follower gate 32, and a row select gate 36. The transfer gate 22 forms part of a transfer transistor for electrically gating the charges accumulated by photodiode 14 to a floating diffusion region 24. A first conductor 26 at the floating diffusion region 24 is in electrical communication with the gate 32 of a source follower transistor through a second conductor 34 (although the conductors, e.g., 26 and 34, are not shown in the exploded view of FIG. 1, they would follow the dotted lines associated therewith to the conductive path 50). The two conductors 26 and 34 are electrically connected via a conductive path 50 in a conductive interconnect layer, e.g., the M1 layer. Sharing the floating diffusion region 24 with the transfer transistor is reset transistor having a gate 28. The reset transistor is connected to a voltage source ($V_{dd}$) through a source/drain region having a conductor 30 for providing a resetting voltage to the floating diffusion region 24.

Figure 13:
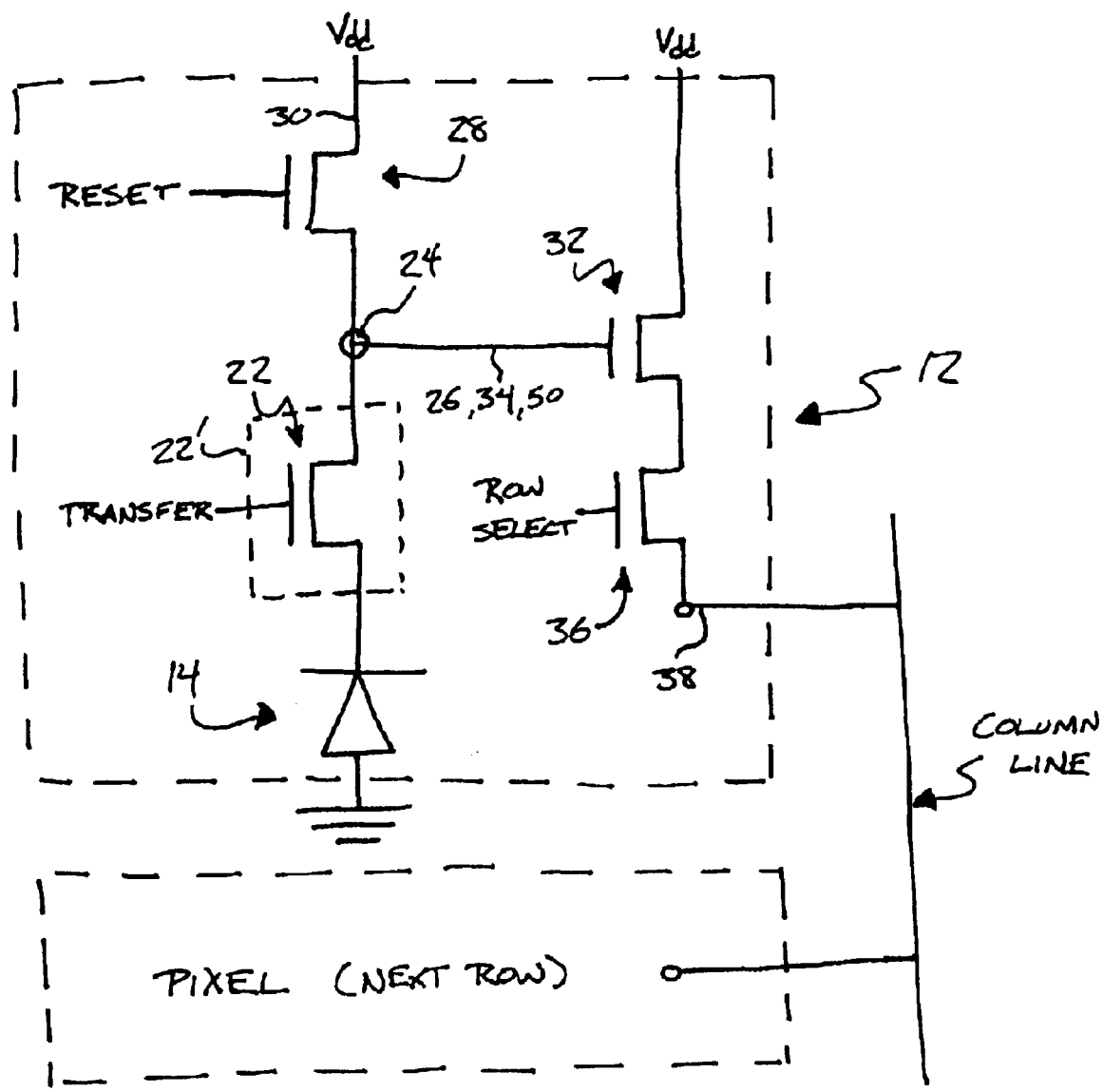
FIG. 13 shows circuit diagram of a 4T pixel like that shown in FIG. 1.

An electrical equivalent circuit for the FIG. 1 pixel is illustrated in FIG. 13 with pixel 12 being operated as known in the art by RESET, TRANSFER, and ROW SELECT signals. As shown in FIG. 13, the 4T circuit can be converted to a 3T circuit by the removal of the portion contained within the dotted box 22', i.e., the transfer transistor, and electrically coupling the photodiode 14 output to the floating diffusion region 24 within the p-type region 16, the floating diffusion region 24 being connected to the gate 32 of the source follower transistor.

Figure 2A:
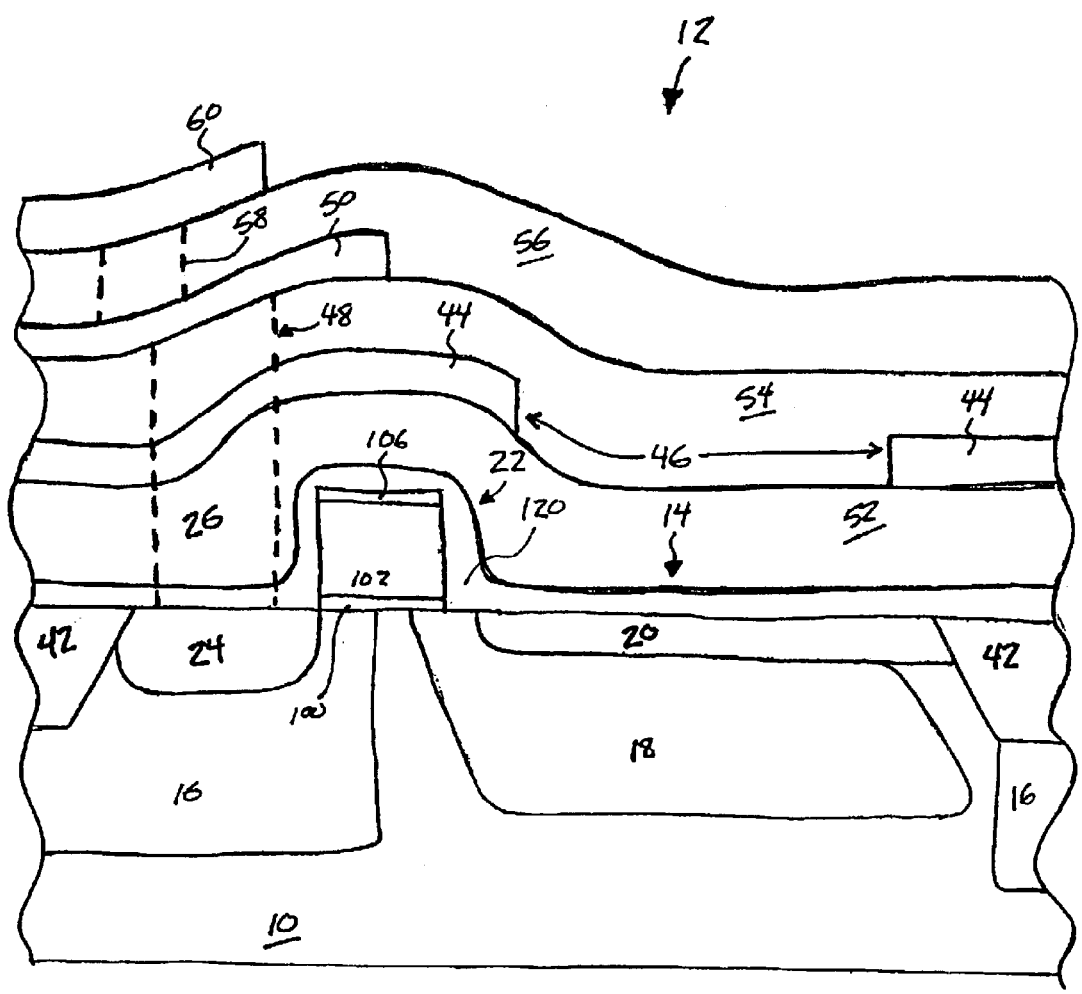

Over the pixel 12 circuitry is a light shield 44, as shown in FIG. 1, which is an opaque material configured to prevent light energy from irradiating the underlying circuitry. The light shield 44 material can comprise $WSi_x$, W, TiN, Ti, Co, Cr, poly/$WSi_x$, Al, Ti/Al, $TiSi_2$/Al, and Ti/Al/TiN, or other materials with the desired light-blocking, electrical, and physical characteristics. The light shield 44 can be very thin. For example, compared to typical metal interconnect layers, which can be about 1,000 Å to about 10,000 Å thick, the light shield 44 need only be thick enough to block light; about 100 Å to about 3,000 Å thick. The specific thickness within this range can be determined by the light absorption/reflection properties of the light shield 44 material. It is preferred that less than 1% of light impacting the light shield 44 be able to penetrate to the underlying wafer. As shown in FIG. 2 and described in relation thereto, a transparent dielectric layer 52 can be positioned between the light shield 44 and the underlying pixel 12. As shown in FIG. 2a, the light shield 44 can be a conformal layer over the pixel 12. Again referring to FIG. 1, an M1 layer containing conductive interconnect pattern 50 is formed above the light shield 44, which is between the pixel transistors and the M1 layer. Optionally, layer 54 can be omitted and the first conductive interconnect layer 50 can be formed directly over the light shield 44 if the light shield 44 is not conductive.

The light shield 44 defines an aperture 46 over the photodiode 14 to allow light to pass thereto. The light shield 44, if conductive, can also optionally be electrically grounded by a grounding circuit 47, by which it can provide electrical shielding to the underlying pixel circuitry. In another embodiment, the light shield 44 can be used for electrical strapping in the periphery. Additional openings 48 are provided in the light shield 44 to allow the various circuitry contacts 26, 30, 34, 40, 38 to be in electrical communication between overlying conductive interconnect layers 50, 60, such as M1, M2, etc., and underlying pixel circuitry, e.g., 22, 28, 32, 36.

FIGS. 2 and 2a show alternative cross sections of a portion of the FIG. 1 pixel 12 taken along the line 2–2' and with some additional detail. As is shown, a light transparent first dielectric layer 52 can be provided over the pixel 12 having an upper surface above the level of the transistor gates, e.g., gate 22, of the pixel 12. Light shield layer 44 is formed over the first dielectric layer 52 above the pixel 12. As shown by FIG. 2a, this light shield 44, as well as the other layers of the pixel cell, can be conformally deposited. A second dielectric layer 54 having similar light transmitting and insulating properties as the first dielectric layer 52 can be formed over the light shield layer 44 (and within the aperture 46). Over this layer can be formed the first conductive interconnect layer 50, i.e., M1 layer, which may be connected by contacts (e.g., conductor 26) to the underlying circuitry provided in openings 48 through the various layers 54, 52, 44. Additional layering over the first conductive interconnect layer 50 is also shown in FIGS. 2 and 2a, such as a third dielectric layer 56 having light transmitting and insulating properties similar to the other two dielectric layers 52 and 54. Over this second dielectric layer 56 can be formed a second conductive interconnect layer 60, which can be in electrical contact with the first conductive interconnect layer 50 (or other parts of the pixel 12 circuitry or imager device) by conductors 58. Additional dielectric, conductive interconnect, or passivation layers can be formed over the second conductive interconnect layer 60, but are not shown for the sake of clarity. Pixel 12 devices as shown in FIG. 1 and FIGS. 2 and 2a can be formed as described below.

Figure 3:
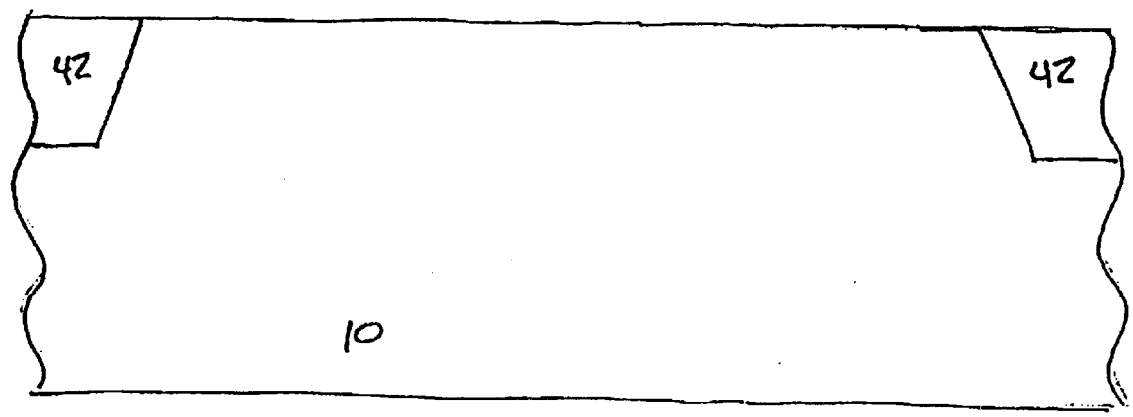
FIG. 3 shows a stage of fabrication of a circuit like that shown in FIGS. 1 and 2 in accordance with the invention.

FIG. 3 shows a preliminary stage of processing. As mentioned above in discussing FIG. 1, each pixel 12 is isolated within the substrate 10 by isolation regions 42, which are preferably STI (shallow trench isolation) regions, but may also be formed by LOCOS processing. FIG. 3 shows the formed STI isolation regions 42. The STI isolation regions 42 can be formed by using a photoresist mask, patterning, and etching to leave trenches where the isolation regions 42 are desired. The photoresist is removed. A layer of dielectric material (e.g., silicon dioxide, silicon nitride, oxide-nitride, nitride-oxide, or oxide-nitride-oxide, etc.) is formed within the trenches by CVD, LPCVD, HDP, or other suitable means. After filling the trenches with the dielectric material, the wafer is planarized, for example by CMP or RIE dry etching processes, and the isolation regions are complete as shown in FIG. 3 and surround the pixel 12 area.

Figure 4:
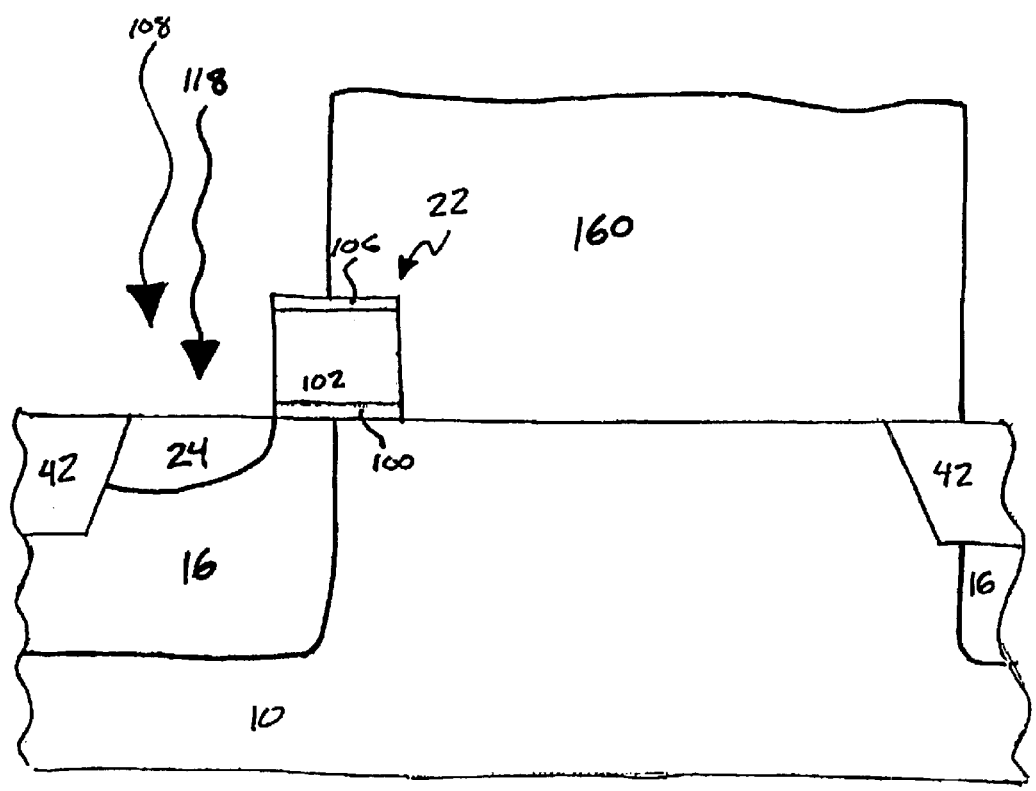
FIG. 4 shows a stage of fabrication of a circuit subsequent to that shown in FIG. 3.

Next, as shown in FIG. 4, transistor gates are formed, including the transfer gate 22 shown in FIG. 1 and FIG. 2. Standard MOS gates are formed by forming a gate oxide layer 100 (e.g., silicon oxide) over the substrate 10, then forming a doped polysilicon layer 102 over the gate oxide layer 100 (the polysilicon layer can be doped in situ or subsequently implanted with a dopant), then forming an insulative cap layer 106 (e.g., oxide or nitride). These layers 100, 102, 106 are then masked, with patterned photoresist for example, and etched to leave stacks, which will be the transistor gates, including the transfer gate 22. In an alternative embodiment, a silicide layer 104 (shown in FIG. 2, but not in FIG. 4) can be formed over the polysilicon layer 102. However, omission of the silicide layer 104 is preferred. Additionally, a $V_t$ implant can be performed during processing as is known in the art.

After forming the gate stacks (e.g., transfer gate 22) a dopant implant 108 is performed in the substrate 10 to form a p-type region 16 beneath a portion of the pixel 12. A photoresist mask 160 prevents the implant 108 from doping the area of the pixel where the photodiode 14 will later be formed (see FIG. 2). As an alternative, the p-type region 16 may be formed by a blanket implant. Note, however, the dopant conductivity types utilized throughout processing can easily be reversed to form a PMOS type pixel structure, as opposed to an NMOS pixel.

After forming the p-type region 16, another implant 118 is used to form a floating diffusion region 24 adjacent the transistor gate stack 22, as is known in the art (source/drain regions 23 for other transistors can be formed simultaneously). The floating diffusion region 24, acts as a source/drain region of the transfer transistor. The floating diffusion region 24 implant 118 can be performed in the implant dose range of about $1\times10^{12}$ to about $2\times10^{16}$ ions/cm². In a preferred embodiment the implant dose range for this implant 118 is about $4\times10^{12}$ to about $2\times10^{15}$ ions/cm² and the floating diffusion region 24 is completed by diffusion.

Figure 5:
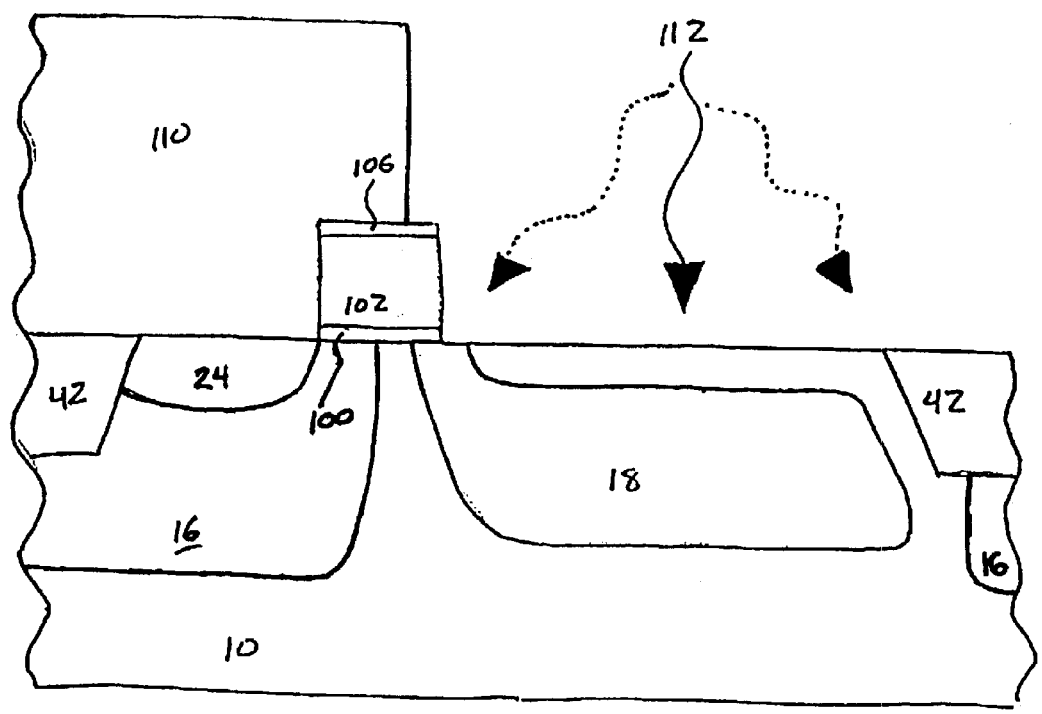
FIG. 5 shows a stage of fabrication of a circuit subsequent to that shown in FIG. 4.
Figure 6:
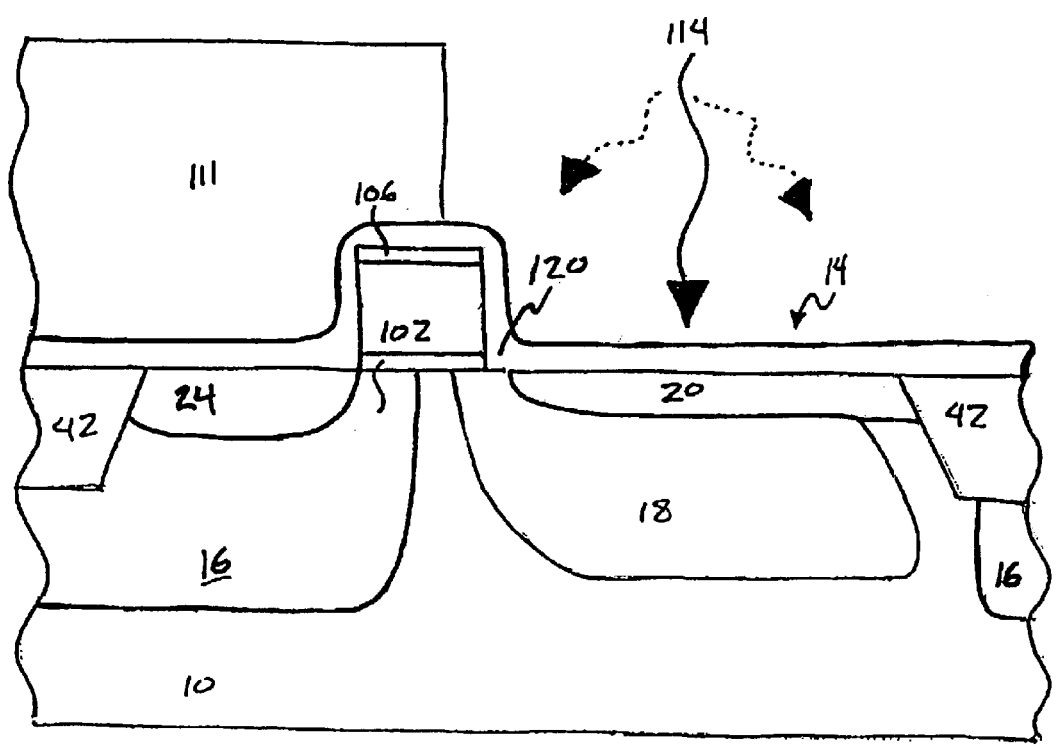
FIG. 6 shows a stage of fabrication of a circuit subsequent to that shown in FIG. 5.

The photodiode 14 (see FIG. 2) comprises a p-n-p structure made of the underlying p-type substrate 10, an n-type region 18 within the p-type well 16, and a p-type layer 20 above the n-type region 18. The layers of the photodiode 14 (i.e., layers 10, 18, and 20) can be formed as shown in FIG. 5 and FIG. 6. FIG. 5 shows the substrate 10 is masked with a patterned photoresist 110 and another ion implantation 112 of a second conductivity type, here n-type, is performed. This forms an n-type region 18 in the pixel's 12 active area and below the transfer gate 22. An angled implant 112 can be utilized to form region 18 to achieve certain spatial characteristics of the photodiode 14.

As shown in FIG. 6, after removing the photoresist 110, an insulating layer 120 is formed over the transistor gate 22 (this same layer 120 can also form sidewall spacers for other transistor gates). Another mask of photoresist 111 is formed partially over the transistor gate 22 and a dopant implant 114 is performed to form a top p-type layer 20 of the photodiode 14. Optionally, an angled implant for implant 114 may be used as well. The photodiode 14 is termed a "pinned" photodiode 14 because the potential in the photodiode 14 is pinned to a constant value when it is fully depleted.

Figure 7:
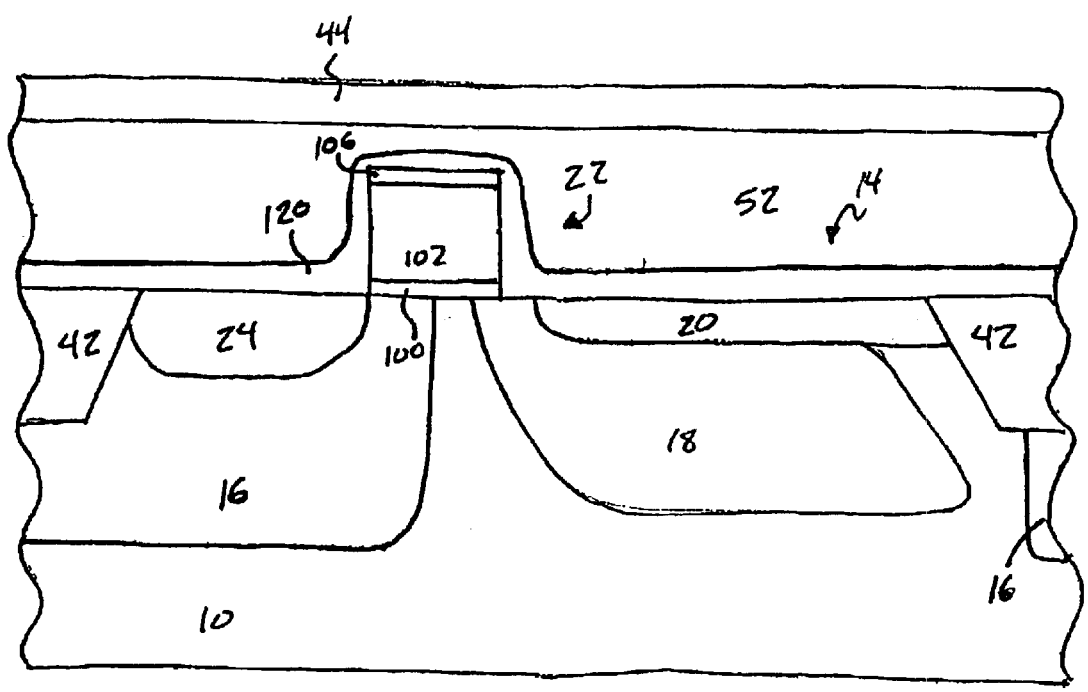
FIG. 7 shows a stage of fabrication of a circuit subsequent to that shown in FIG. 6.

As shown in FIG. 7, a dielectric layer 52 is deposited over the pixel 12 circuitry, including the transfer gate 22. This dielectric layer 52 should be optically transparent so as not to impede light from reaching the photodiode 14. The dielectric layer 52 can comprise, e.g., silicon oxides or nitrides, glasses, or polymeric materials, and can be deposited by evaporative techniques, CVD, PECVD, sputtering, or other techniques known in the art. The dielectric layer 52 may be planarized by various techniques, such as CMP or RIE etching. Alternatively, if a conformal dielectric layer is desired (see FIG. 2a), the planarization step can be excluded. The light shield 44 is formed over the dielectric layer 52 by depositing a layer of opaque or nearly opaque material as a thin film thereon. The light shield is preferably about 100 Å to about 3,000 Å thick. The light shield 44 should be of a thickness and material so as to allow less than 1% of impacting light to be transmitted therethrough and can be a conductive or insulative material. The light shield 44 material can comprise, e.g., $WSi_x$, W, TiN, Ti, Co, Cr, poly/$WSi_x$, Al, Ti/Al, $TiSi_2$/Al, and Ti/Al/TiN. Such materials can be deposited on the dielectric layer 52 by conventional methods, such as by evaporation techniques, physical deposition, sputtering, CVD, etc. The light shield 44 can be a conformal layer (see FIG. 2a) or a planar layer. The light shield 44 can be electrically conductive or electrically insulative. If formed of a conductive material, the light shield 44 can be connected to ground, thereby offering an electrical shield to protect the underlying circuitry from the overlying conductive interconnect, e.g., metallization, layers, which will be formed in subsequent steps. The light shield 44 is positioned relatively close to the underlying photodiode, as compared to those of the prior art formed in the M1 and/or M2 layers. Thus, the detrimental effects of light piping and shadowing are mitigated.

Figure 8:
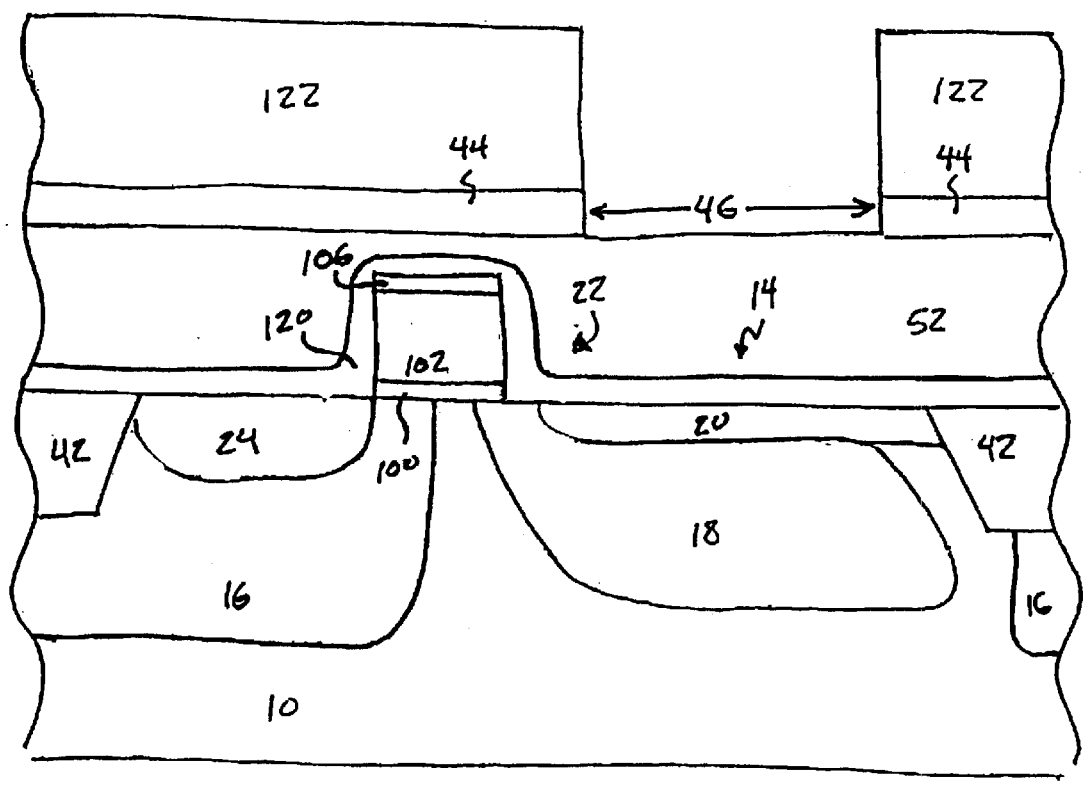
FIG. 8 shows a stage of fabrication of a circuit subsequent to that shown in FIG. 7.
Figure 9:
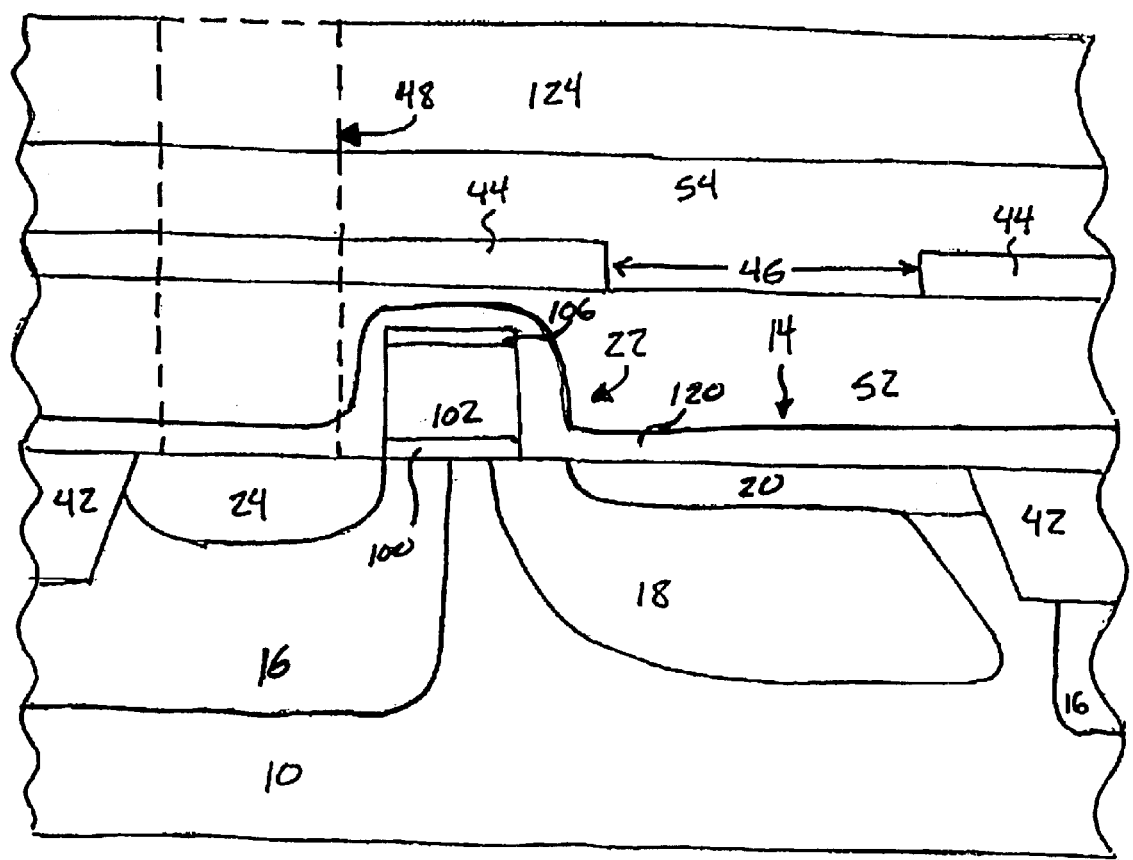
FIG. 9 shows a stage of fabrication of a circuit subsequent to that shown in FIG. 8.

Next, as shown in FIG. 8, a patterned photoresist mask 122 is formed over the light shield 44 layer. Subsequently, the light shield 44 layer is etched to form an aperture 46 over the photodiode 14. The dielectric layer 52 can serve as an etchstop. Then, as shown in FIG. 9, a second dielectric layer 54 is deposited over the light shield 44 and within the aperture 46 over the first dielectric layer 52. This dielectric layer 54 can be the same or similar in composition and light transmission and dielectric properties as the first dielectric layer 52 and can be deposited in a similar fashion. This second dielectric layer 54 can be planarized by CMP or RIE etching techniques, or alternatively, can be a conformal layer. A patterned photoresist 124 is formed over the second dielectric layer and the wafer is subsequently etched to form openings 48 through the two dielectric layers 52 and 54 and the light shield 44 to expose the active areas in the substrate, including the floating diffusion region 24.

Figure 10:
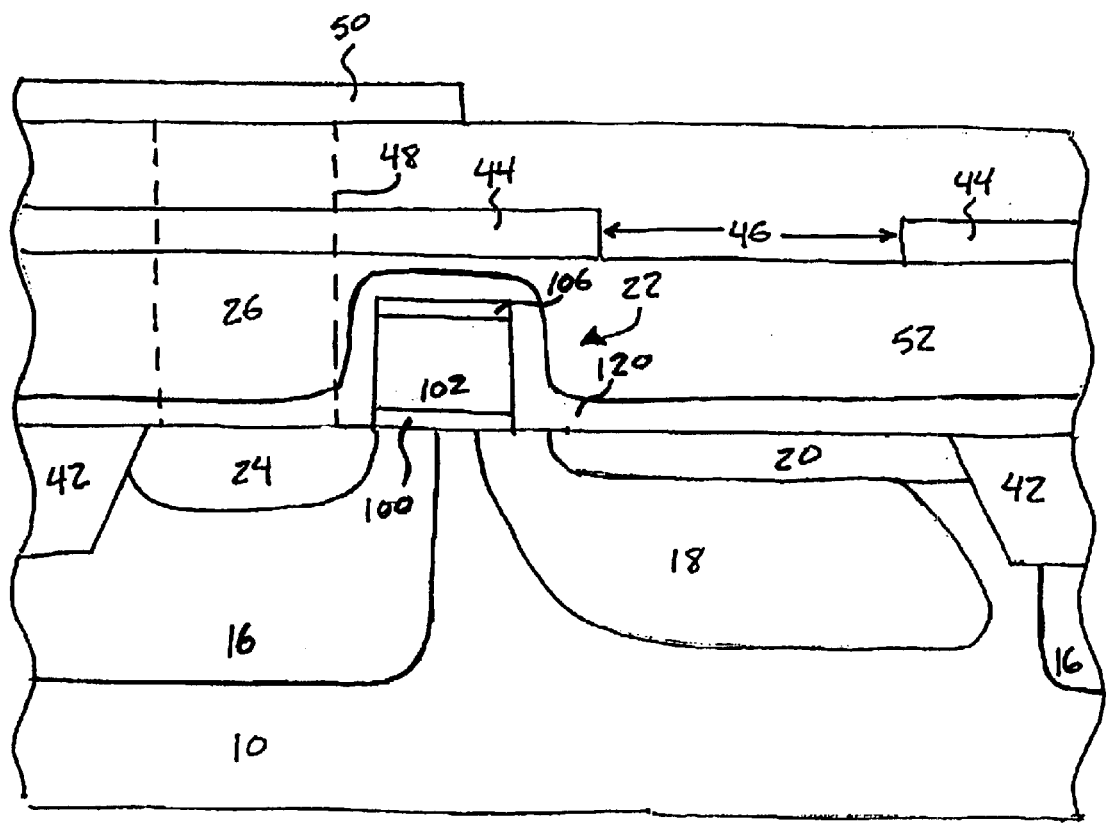
FIG. 10 shows a stage of fabrication of a circuit subsequent to that shown in FIG. 9.

Conductors to the pixel 12 circuitry's active areas are formed within the openings 48 as shown in FIG. 10. Optionally, a thin insulating layer (not shown) can be deposited within the openings 48 to electrically isolate the light shield 44, if conductive, from the conductors. One such conductor 26 is formed to the floating diffusion region 24. Over the second dielectric layer 54 and in electrical communication with conductor 26 a conductive interconnect layer 50, preferably of metal, is deposited to form an M1 layer. Preferably, the conductive interconnect layer 50 should not extend over the aperture 46 and photodiode 14 if composed of an opaque or translucent material. However, transparent or semi-transparent materials such as, e.g., polysilicon, can be used for the conductive interconnect layer 50, and if so they can overly the photodiode 14, if desired.

The floating diffusion region 24 is electrically connected with the source follower gate 32 through standard metallization steps, e.g., forming a conductor 26 to the floating diffusion region 24 and a conductor 34 (see FIG. 1) to the source follower gate, and forming a conductive interconnect 50 therebetween. Conductor 26 is in electrical communication with the M1 conductive interconnect layer 50 and there through with the source follower gate 32 and the rest of the integrated circuit, of which the pixel 12 is a part. Additional processing can follow, such as formation of an overlying dielectric layer 56 and a second conductive interconnect layer 60 (M2), as known in the art.

Figure 11:
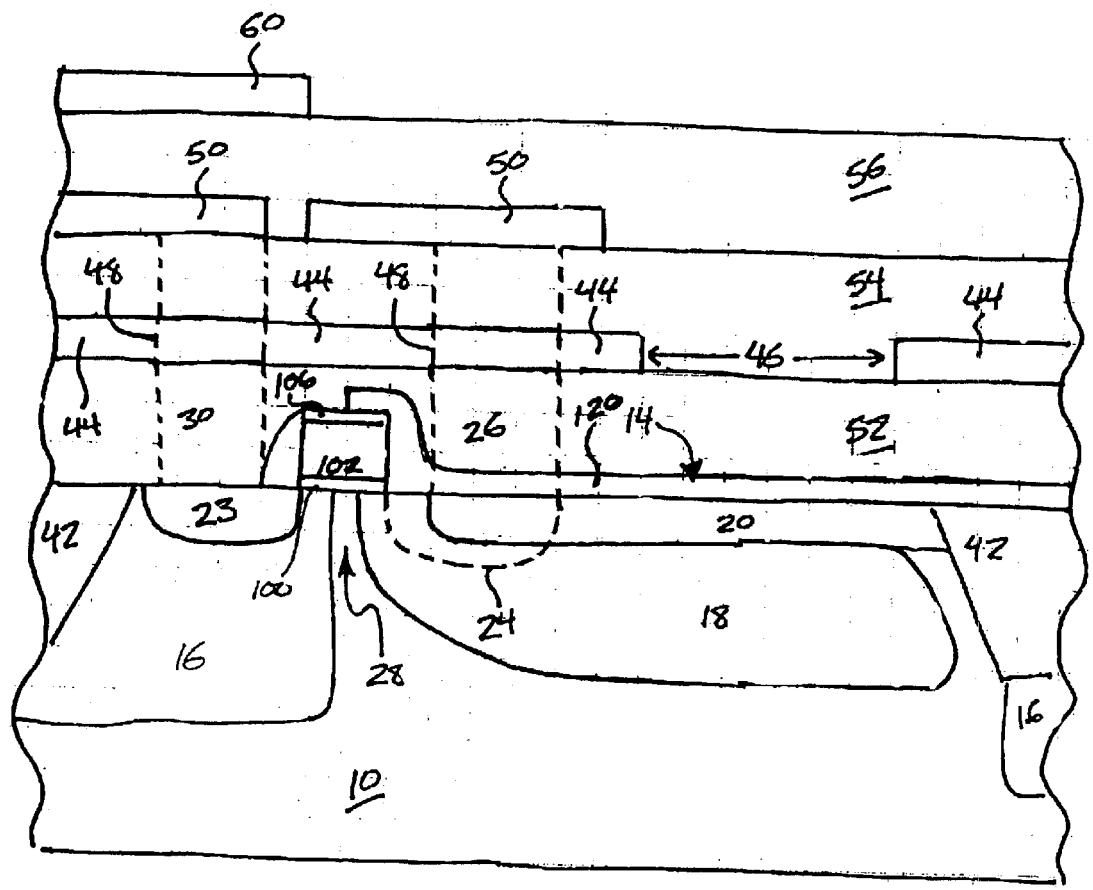
FIG. 11 shows a partial cross-sectional view of a 3T pixel similar to the 4T pixel shown in FIG. 1 and FIG. 2 through the same cross-section portion of the pixel as line 2–2' of FIG. 1.

As indicated above, the light shield 44 of the invention is suitable for use with the circuitry of any CMOS pixel, no mater how many transistors are used in the pixel circuit. FIG. 11 shows a cross-section of a 3T pixel 12, which is similar in most ways to the 4T circuit discussed above, but differs in that the transfer gate 22 is removed. The photodiode 14 is electrically linked directly with the source follower gate 32 through the floating diffusion region 24 and conductor 26, the M1 conductive interconnect layer 50, and conductor 34. No transfer transistor is needed to gate charges generated at the photodiode 14 since the floating diffusion region 24 is in direct electrical contact with the photodiode 14. However, the reset gate 28 is still provided and is electrically connected to a voltage source ($V_{dd}$) via contact 30 and part of the conductive path 50.

Figure 12:
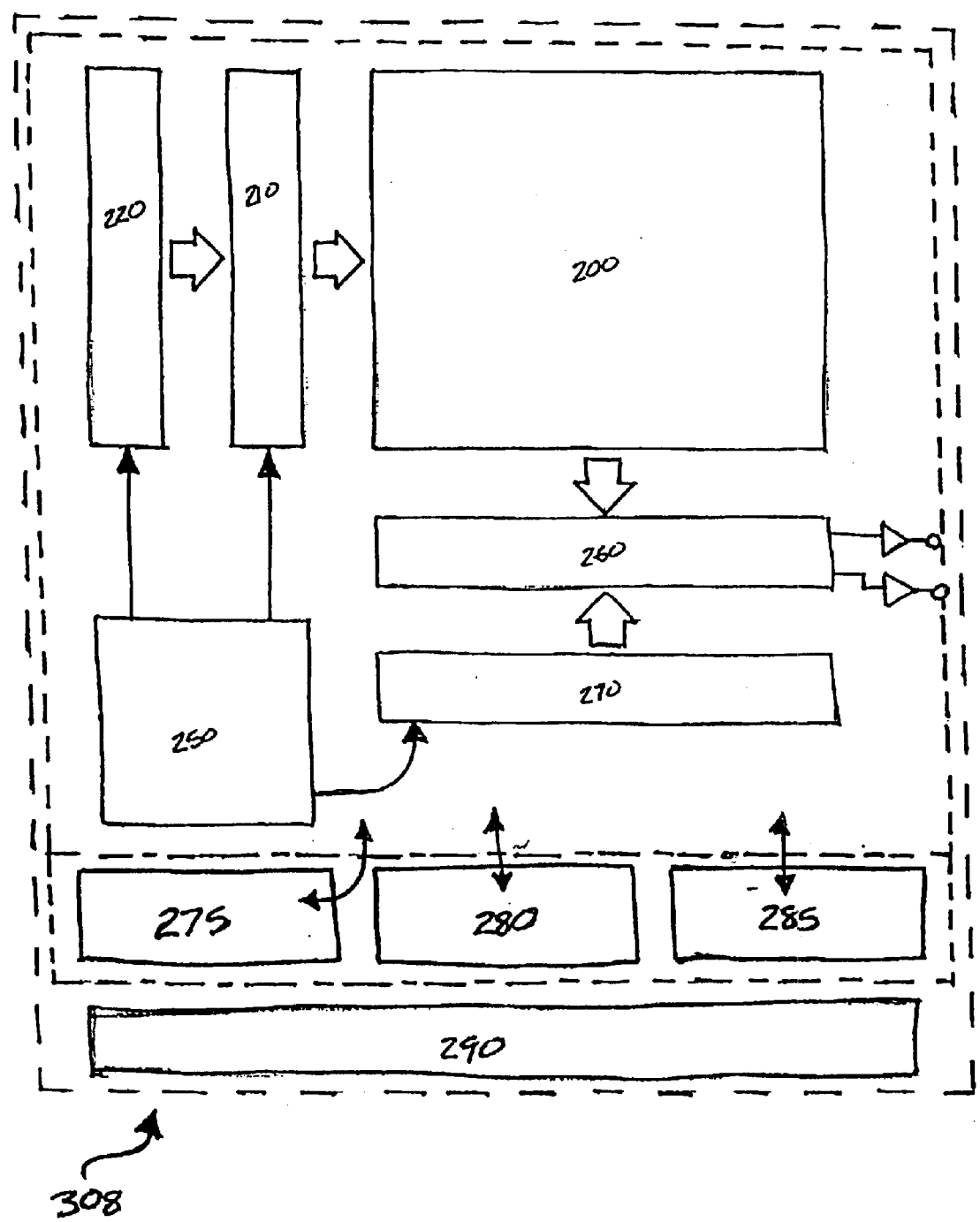
FIG. 12 shows a pixel array integrated into a CMOS imager system in accordance with the invention.

FIG. 12 illustrates a block diagram for a CMOS imager device 308 having a pixel array 200 incorporating pixels 12 constructed in the manner discussed above in relation to FIG. 1 through FIG. 11. Pixel array 200 comprises a plurality of pixels 12 arranged in a predetermined number of columns and rows. The pixels 12 of each row in array 200 can all be turned on at the same time by a row select line and the pixels 12 of each column are selectively output by a column select line. A plurality of rows and column lines are provided for the entire array 200. The row-lines are selectively activated by the row driver 210 in response to row address decoder 220 and the column select lines are selectively activated by the column driver 260 in response to column address decoder 270. Thus, a row and column address is provided for each pixel 12.

The CMOS imager device 308 is operated by the control circuit 250 which controls address decoders 220, 270 for selecting the appropriate row and column lines for pixel readout, and row and column driver circuitry 210, 260 which apply driving voltage to the drive transistors of the selected row and column lines. A memory 275, e.g., an SRAM, can be in communication with the array 200 and control circuit 250. A serializer module 280 and SFR (Special Function Register) device 285 can each be in communication with the control circuit 200. Optionally, a localized power source 290 can be incorporated into the imager device 308.

Typically, the signal flow in the imager device 308 would begin at the array 200 upon its receiving photo-input and generating a charge. The signal is output to a read-out circuit and then to an analog-to-digital conversion device. Then the signal is transferred to a processor, then the serializer, and then the signal can be output from the imager device to external hardware.

Figure 14:
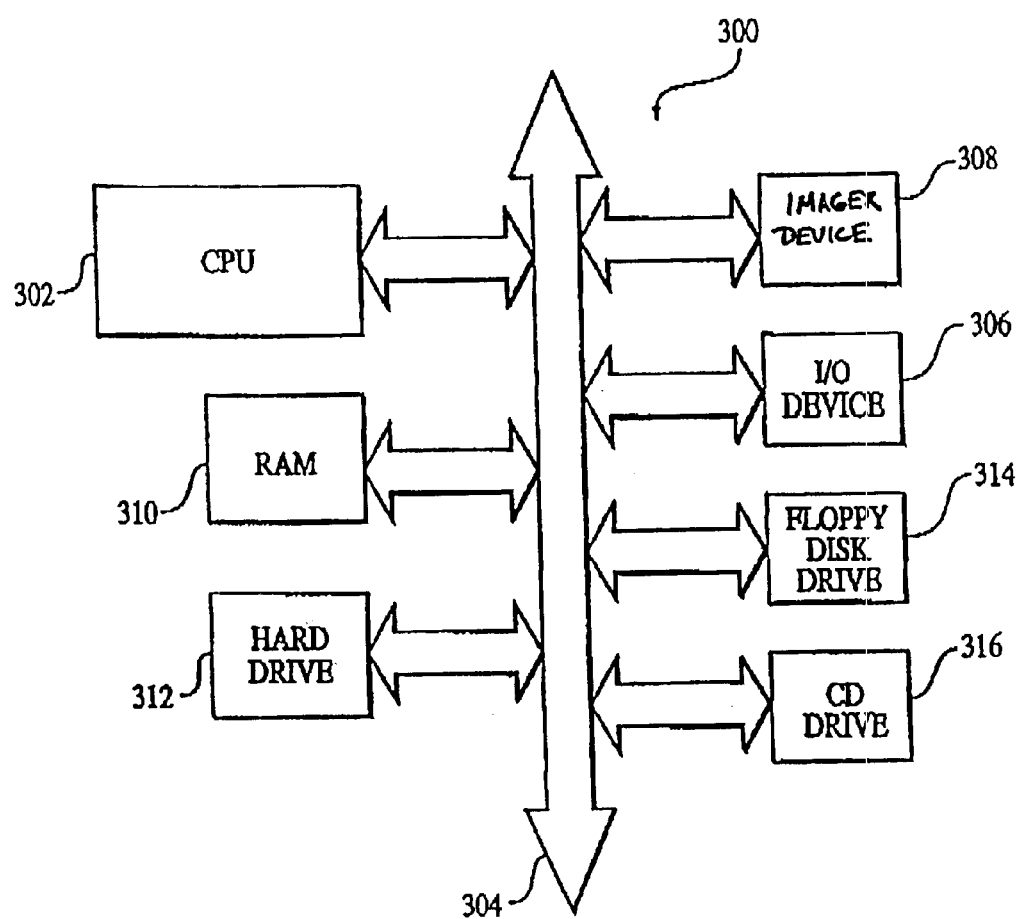
FIG. 14 shows a processor system incorporating at least one CMOS imager device, like that shown in FIG. 12, in accordance with the invention.

FIG. 14 shows system 300, a typical processor based system modified to include an imager device 308 as in FIG. 12 and an input device to the system 300. The imager device 308 may also receive control or other data from system 300 as well. Examples of processor based systems, which may employ the imager device 308, include, without limitation, computer systems, camera systems, scanners, machine vision systems, vehicle navigation systems, video telephones, surveillance systems, auto focus systems, star tracker systems, motion detection systems, image stabilization systems, and others.

System 300 includes a central processing unit (CPU) 302 that communicates with various devices over a bus 304. Some of the devices connected to the bus 304 provide communication into and out of the system 300, illustratively including an input/output (I/O) device 306 and imager device 308. Other devices connected to the bus 304 provide memory, illustratively including a random access memory (RAM) 310, hard drive 312, and one or more peripheral memory devices such as a floppy disk drive 314 and compact disk (CD) drive 316. The imager device 308 may be combined with a processor, such as a CPU, digital signal processor, or microprocessor, in a single integrated circuit.

The processes and devices described above illustrate preferred methods and typical devices of many that could be used and produced. The above descriptions and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. An imager device, comprising:
   a pixel photoconversion device;
   pixel circuitry in electrical communication with said pixel photoconversion device;

a light shield layer, said light shield layer provided over said pixel circuitry and having a light transmission area over said photoconversion device; and at least one interconnect layer, all said interconnect layers being provided over said light shield layer.

2. The imager device of claim 1, wherein said pixel circuitry comprises a transfer transistor for electrically connecting said photoconversion device to a diffusion region, said diffusion region being electrically coupled to a transistor gate by a conductor, which is provided in said at least one interconnect layer.

3. The imager device of claim 2, wherein said conductor is provided in a first metal interconnect layer provided over said light shield layer.

4. The imager device of claim 1, wherein said photoconversion device is electrically coupled to a diffusion region, said pixel circuitry further comprising a conductor for electrically connecting said diffusion region to a transistor gate, said conductor being provided in said at least one interconnect layer.

5. The imager device of claim 4, wherein said conductor is provided in a first conductive interconnect layer provided over said light shield layer.

6. The imager device of claim 1, wherein said photoconversion device is a photosensor selected from the group consisting of a photodiode, a photogate, and a photoconductor.

7. The imager device of claim 1, wherein said photoconversion device is a photodiode.

8. The imager device of claim 1, wherein said light shield is an electrically conductive layer.

9. The imager device of claim 1, wherein said light shield is an electrically insulative layer.

10. The imager device of claim 1, wherein said light transmission area of said light shield is an aperture in said light shield layer.

11. The imager device of claim 1, wherein said light shield comprises a material selected from the group consisting of tungsten, tungsten silicide, titanium, titanium nitride, cobalt, chromium, polysilicon-tungsten silicide, aluminum, titanium silicide, and combinations thereof.

12. The imager device of claim 1, further comprising a grounding circuit in electrical contact with said light shield.

13. The imager device of claim 1, further comprising openings in said light shield configured to allow conductors to pass therethrough.

14. The imager device of claim 1, wherein said at least one interconnect layer comprises at least a first and a second interconnect layer above said first interconnect layer.

15. The imager device of claim 1, wherein said light shield is about 100 Å to about 3,000 Å thick.

16. The imager device of claim 1, wherein said light shield allows less than 1% of light impacting thereon to be transmitted to said underlying pixel circuitry.

17. The imager device of claim 1, wherein said at least one interconnect layer is at least partially transparent at portions which overlie said photoconversion device.

18. The imager device of claim 1, wherein said light shield layer is a planar layer over said pixel circuitry.

19. The imager device of claim 1, wherein said light shield layer is a conformal layer over said pixel circuitry.

20. The imager device of claim 1, wherein said imager device is a CMOS imager device.

21. An integrated circuit containing at least one CMOS pixel sensor cell, said pixel sensor cell comprising:

a semiconductor substrate;

a photosensor within said substrate;

a transistor gate over said substrate for gating charges produced by said photosensor;

a light-blocking film over said substrate and said transistor gate, but under all conductive interconnect layers of said integrated circuit, wherein said light-blocking film has an opening over said photosensor; and a first conductive interconnect layer over said light-blocking film.

22. The CMOS pixel sensor cell of claim 21, wherein said transfer transistor gates charges from said photosensor to a source follower transistor.

23. The CMOS pixel sensor cell of claim 21, wherein said first conductive interconnect layer electrically connects a region which receives changes from said photodiode to the gate of a source follower transistor.

24. The CMOS pixel sensor cell of claim 21, wherein said light-blocking film is grounded.

25. The CMOS pixel sensor cell of claim 21, wherein said light-blocking film has openings for allowing contacts to circuitry of underlying said pixel sensor cell to pass therethrough.

26. The CMOS pixel sensor cell of claim 21, wherein said photosensor is a photodiode.

27. An imager system, comprising:

a processor; and an imaging device electrically coupled to said processor, said imaging device comprising a CMOS pixel array, at least one pixel of said array comprising:

a pixel photoconversion device;

pixel circuitry in electrical communication with said pixel photoconversion device;

a light shield layer, said light shield layer provided over said pixel circuitry and having a light transmission area over said photoconversion device; and at least one interconnect layer, all said interconnect layers being provided over said light shield.

28. The imager system of claim 27, wherein said at least one interconnect layer comprises at least a first and a second interconnect layer above said first interconnect layer.

29. The imager system of claim 27, wherein said light shield is about 100 Å to about 3,000 Å thick.

30. A CMOS imager pixel having pixel circuitry in electrical communication with a photoconversion device and electrically interconnected through at least one conductive interconnect layer, comprising:

a light shield layer provided between said pixel circuitry and any conductive interconnect layers and having a light transmission area over said photoconversion device.

31. The CMOS imager pixel of claim 30, wherein said light shield layer is configured to allow less than 1% of light impacting said light shield layer to transmit to said pixel circuitry.

32. The CMOS imager pixel of claim 30, wherein said light shield layer is a conformal layer separated from said pixel circuitry by a dielectric layer.

33. A CMOS imager device, comprising:

a pixel array having a plurality of pixels, each of said pixels having pixel circuitry in electrical communication with a photoconversion device and a light shield provided between said pixel circuitry and any metal interconnect layers, said light shield having a light transmission area over said photoconversion device, wherein an electrical signal flow is generated by said pixel array in response to photo-input;

a read-out circuit configured to receive said electrical signal flow from said pixel array;

an analog-to-digital conversion device configured to receive said electrical signal flow from said read-out circuit;

a processor configured to receive said electrical signal flow from said analog-to-digital device; and a serializer configured to receive said electrical signal flow from said processor.

34. The CMOS imager device of claim 33, wherein said electrical signal flow is output from said imager device to external hardware.

\* \* \* \* \*